United States Patent
Huang

(10) Patent No.: US 7,245,160 B2
(45) Date of Patent: Jul. 17, 2007

(54) SHORT PULSE REJECTION CIRCUIT

(75) Inventor: Chao-Sheng Huang, Hsin Tien (TW)

(73) Assignee: Via Technologies Inc., Taipei Hsien (TW)

( * ) Notice: Subject to any disclaimer, the term of this patent is extended or adjusted under 35 U.S.C. 154(b) by 0 days.

(21) Appl. No.: 11/052,797

(22) Filed: Feb. 9, 2005

(65) Prior Publication Data
US 2005/0184783 A1 Aug. 25, 2005

(30) Foreign Application Priority Data
Feb. 20, 2004 (TW) ............... 93104277 A

(51) Int. Cl.
G01R 29/02 (2006.01)
H03K 9/08 (2006.01)

(52) U.S. Cl. .......................... 327/34; 327/36

(58) Field of Classification Search ................ 327/34, 327/291, 36, 38, 173, 174, 176, 182, 183
See application file for complete search history.

(56) References Cited
U.S. PATENT DOCUMENTS
4,216,388 A * 8/1980 Wilson .................. 327/34
5,111,480 A * 5/1992 Sarkoezi .................. 375/214
5,309,034 A * 5/1994 Ishibashi .................. 327/174
5,812,000 A * 9/1998 Kobayashi et al. ......... 327/172
6,064,237 A * 5/2000 Lee .......................... 327/34
6,294,939 B1 * 9/2001 McClure .................. 327/172
6,621,319 B1 * 9/2003 Herrera et al. ........... 327/221

* cited by examiner

Primary Examiner—Quan Tra
Assistant Examiner—Rey Aranda
(74) Attorney, Agent, or Firm—Birch, Stewart, Kolasch & Birch, LLP

(57) ABSTRACT

A short pulse rejection circuit is disclosed. The circuit comprises a signal transition detecting circuit, a control signal generating circuit, a capacitor resetting and charging circuit, and a charge pulse detecting circuit. The signal transition detecting circuit is to output detecting pulses in response to any input pulse. The control signal generating circuit generates two control signals for capacitor charging and discharging in response to the detecting pulses. The capacitor resetting and charging circuit generates discharging and charging signals in response to two control signals. The charge pulse detecting circuit generates output enable pulse and outputting a short pulse rejected pulses in response to the charging signals and original input pulse.

7 Claims, 4 Drawing Sheets

SHORT PULSE REJECTION CIRCUIT

FIELD OF INVENTION

This invention relates to a circuit, more particularly, to a circuit having a signal detecting and converting circuit, a control signal generating circuit, and a resetting circuit in series connected, which provides a function of filtering those pulses having their pulse width narrower than a predetermined value but allowing a pass through otherwise.

BACKGROUND OF INVENTION

For integrated circuits, the role of the input/output (I/O) pad likely acts as a bridge which communicates the chip itself to another. An ideal I/O pad serves as a buffer without signal gain or degradation, as is shown in FIG. 1a with an input terminal A and an output terminal Z. As a signal pulse imposes on the input terminal A, the signal is fed into the buffer, usually an even numbers of inverters, for a time delay of about several nano-seconds, the output terminal Z should get the same pulse width as the original one.

If a low pass filter is added to the I/O pad to make the I/O pad have the function of filtering, it may result in malfunctioning. An example is shown in FIG. 1b. It shows a low pass filter I/O pad series connected with two inverters having a capacitor C in between, where "A" is an input terminal, "Z" being an output terminal, and $V_{CP}$ is the terminals voltage of the capacitor C. Assuming the forgoing low pass filter circuit is desired to filter those pulses having short pulse width, such as 20 ns and below, the filter may get a malfunction due to the situation described below. Supposing a first pulse H1 having pulse width 15 ns is passed through the first inverter INV1, the signal charging the capacitor C to a voltage of $V_{cp}$ is followed. Since the $V_{CP}$ does not reach the threshold voltage $V_{TH}$ of the second inverter INV2, $V_Z$=0 is resulted. Hence, the pulse H1 had been filtered out successfully. Thereafter, $V_A$ returns to its original level (e.g. 0) for a time duration L (e.g. 5 ns), and then the charges in the capacitor C, discharge through the first inverter INV1. However, if the capacitor C is not discharged completely within the time duration L, and a second pulse H2 following H1 is exerted on terminal A, the $V_{CP}$ may still possibly attain to the threshold voltage of $V_{TH}$ of the second inverter INV2 even though the pulse width of the second pulse H2 is smaller than 20 ns due to the residue charges in the capacitor C. In other words, the interval between pulses H1 and H2 becomes critical. Thus, taking the time duration L=5 ns as an example, as shown in FIG. 1b, the pulse H2 may make the $V_{CP}$ exceed $V_{TH}$ while approaching the ending of the pulse H (it may be about 10 ns). As a result, an undesired pulse H2 appears at the output terminal Z.

An object of the present invention is thus to provide a circuit, which utilizes feed back signals associated with MOS (Metal-Oxide-Semiconductor) transistors, to reset the charging/discharging circuit. The high current drivability of the MOS makes the operation of fast charging/discharging possible, and prevents the malfunction due to residual charges.

SUMMARY OF THE INVENTION

A short pulse rejection circuit is disclosed. The circuit comprises a signal detecting and converting circuit, a control signal generating circuit, a capacitor resetting and charging circuit, and a charge pulse detecting circuit. The signal detecting and converting circuit is set to output detecting pulses in response to any input pulse transit. The control signal generating circuit generates two control signals for capacitor charging and discharging in response to the detecting pulses. The capacitor resetting and charging circuit generates discharging and charging signals in response to two control signals. The charge pulse detecting circuit generates output enable pulse and outputting a short pulse rejected pulses in response to the charging signals and original input pulse.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more clearly understood from the following detailed descriptions and the accompanying drawings, which are given by way of illustration only, and thus are not limitative of the present application, and in which.

DESCRIPTION OF THE PREFERRED EMBODIMENT

As in the forgoing descriptions in the prior art, an input/output pad associated with a simple RC (Resistor Capacitor) low pass circuit is not safe for filtering those high frequency noises, especially, if an interval in between two high frequency noises is short. This is because the charges stored in the capacitor do not have enough time to discharge completely while the first noise is filtered and the second one followed within a short time. As a result, accumulated charges will make the second noise over a threshold condition, and thus resulted in a malfunction. The present invention can overcome these problems.

Figure 1:
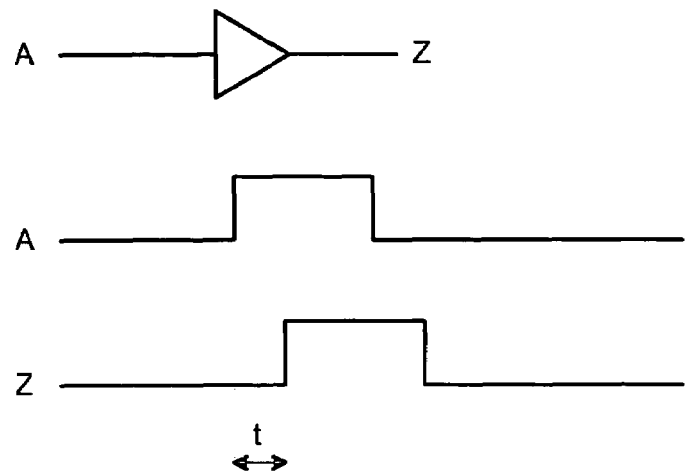
FIG. 1a illustrates a traditional I/O pad the same as a buffer but does not serve as a signal filter.
FIG. 1b illustrates a traditional I/O pad associated with a low pass filter to filter a high frequency signal but it will fail to filter those signals providing with a very short time interval.
Figure 1:
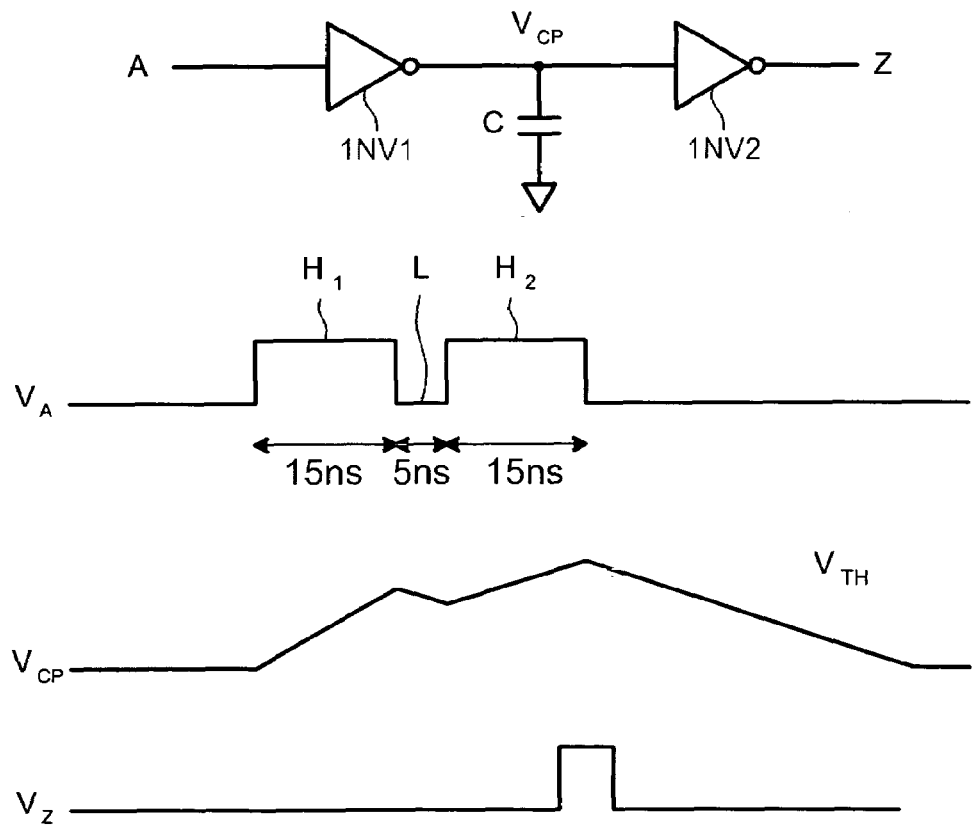
Figure 2:
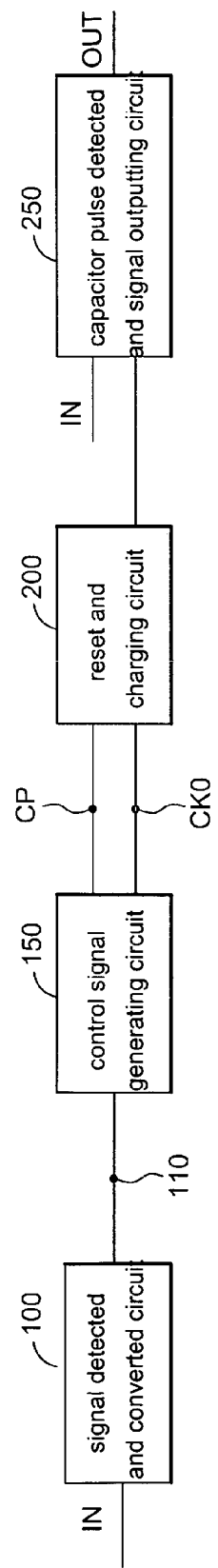
FIG. 2 shows a function block of circuit for short pulse rejection in accordance with the present invention.
Figure 4:
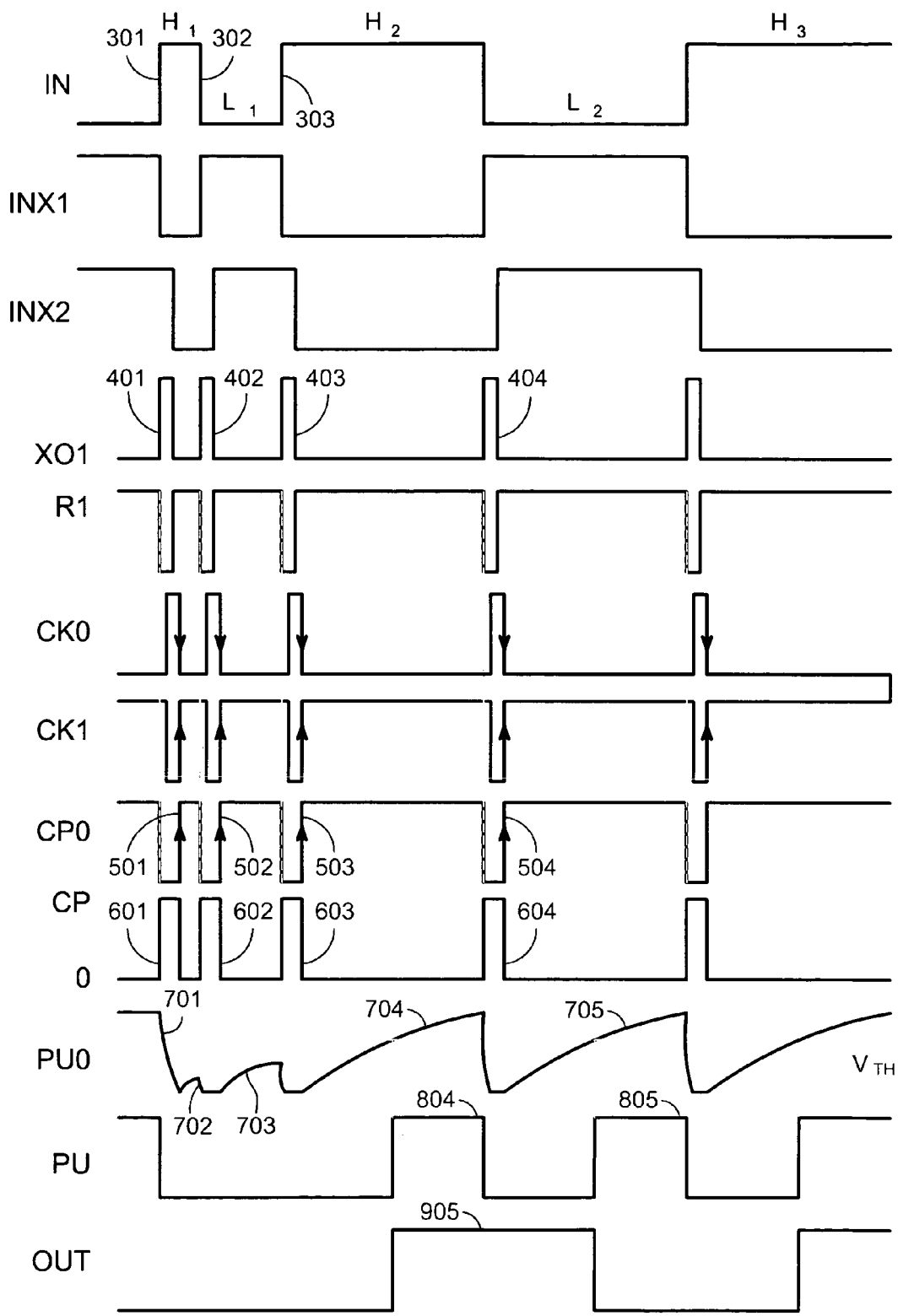
FIG. 4 shows a pulse-timing diagram in response to the input signal in accordance with the present invention.

The functional blocks of the short pulse rejection circuit according to the present invention is shown in FIG. 2, the circuit includes a signal detecting and converting circuit 100, a control signal generating circuit 150, a resetting and charging circuit 200, and a capacitor pulse detected and signal outputting circuit 250, in series connected in order. The signal detecting and converting circuit 100 has a signal receiving terminal IN and an output terminal 110. The circuit 100 generates a detecting pulse at the output terminal 110 while a pulse signal received by the signal-receiving terminal IN is in occurrence with a raising edge or falling edge. In response to the detected pulse, two control signals CP and CK0 are generated by the control signal generating circuit 150. The resetting and charging circuit 200 provides a function of fast charging or discharging of the capacitor 204, as shown in FIG. 4 according to signals CP and CK0. The capacitor pulse detected and signal outputting circuit 250 then respond the signal IN and the charges in the capacitor 204 to determine if the terminal voltage of the capacitor 204 over a predetermined threshold or not. If so, a resulted pulse OUT having a short pulse rejection is outputted in response to receiving signal IN.

Referring to FIG. 4, a pulses-timing diagram is shown. The signal detecting and converting circuit 100 generates a detected pulse signal X01 to the control signal generating circuit 150 while the input signal IN has its edges either raising or falling. Otherwise, the X01 keeps at voltage level 0.

Figure 3:
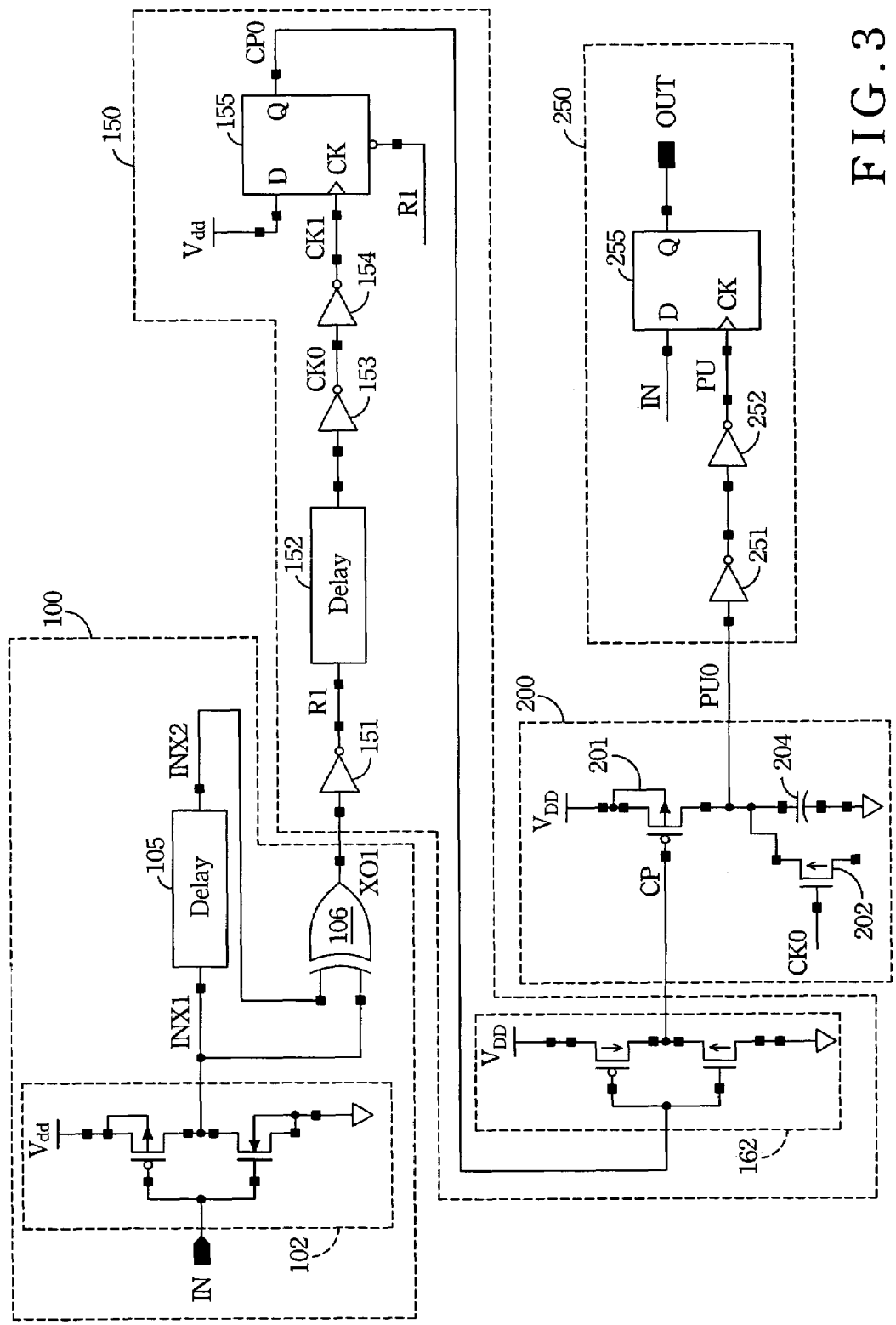
FIG. 3 shows a short pulse rejection circuit in accordance with the present invention.

Please refer to FIG. 3. The signal detecting and converting circuit 100 includes a first CMOS 102 with an input terminal for receiving a signal IN, an output terminal connected with a first signal delay circuit 105 and input terminal of an Exclusion Or gate (XOR) 106. The first signal delay circuit 105 may be composed of even numbers of inverters to generate a time delayed signal. The signal outputted from the CMOS 102 that is delayed about t1 time unit by the first signal delay circuit 105 is fed to the second input terminal of XOR 106. Hence, as is shown in FIG. 4, if the input pulse signal IN with an edge transit no matter what the situation is low to high or high to low, the XOR will output a pulse signal XO1 of about t1 in pulse width. Preferably, the delayed time t1 done by first signal delay circuit 105 is limited within 2 ns. The fact of time delayed too long may cause the current pulse signal with the previous pulse signal proceeding XOR operation but not the signal INX2 XOR the signal INX1.

The control signal generating circuit 150 includes a first inverter 151, a second delay circuit 152, a second inverter 153, a third inverter 154, an edge-trigger-reset D flip-flop 155, and a second CMOS 162. The output signal R1 of the first inverter 151 functions as an input signal of both D flip-flop 155 and the second delay circuit 152. The second delay circuit 152 delays a time unit t2 to avoid DC current path from MOS 201 to MOS 202 and meet the set up time constrain of the D flip-flop 155.

The second inverter 153 outputs the signal ck0 for both the third inverter 154 and the resetting and charging circuit 200. The third inverter 154 then generates signal ck1, which functions as a clock signal ck of the D flip-flop 155. Consequently, the clock signal ck of the D flip-flop 155 at least lags behind the signal R1 by t2. The input terminal of the D flip-flop 155 is connected to a signal $V_{dd}$, and the output terminal Q outputs a signal cp0, which is fed into the input terminal of the second CMOS 162.

The reset and charging circuit 200 having a pMOS 201, cascodes over an nMOS 202 and a capacitor 204. The nMOS 202 and the capacitor 204 are connected in parallel. The switch of the pMOS 201 is controlled by the signal CP and the switch of the nMOS 202 is controlled by the signal CK0.

The pulse detected by the capacitor and signal output circuit 250 is composed of a fourth inverter 251, a fifth inverter 252 and an edge-trigger D flip-flop 255. The fourth inverter 251, in series connected with the fifth inverter 252 and then feeds into the clock terminal CK of the second D flip-flop 255. The input terminal D of the D flip-flop 255 is to receive input signal IN, and the output terminal Q outputs the signal OUT, which is an aimed signal free from short pulse.

The operations of the circuit according to the present invention are shown in FIG. 4, a timing diagram. As the input signal IN varies, for example at time t0, a pulse H1 appeal, the first CMOS 102 outputs an signal INX1 and a time lagged signal INX2, which make the XOR gate 106 outputs two pulses 401 and 402, which correspond, respectively, the rising edge 301 and falling edge 302 of the pulse H1. As is shown in FIG. 4, the invert signals R1 are inversed of the pulses 401 and 402. The inverse of signals R1 is delayed by the second delayed circuit 152 and further is inversed again by the second inverter 153, two signals CK0 are thus resulted. The two signals CK0 are further inverted to generate signals CK1 by the third inverter 154. Since the D flip-flop 155 is an edge-trigger type, thus in response to the raising edges of the clock signals CK1, the signals CP0 formed are resulted. See the left edges 501 and 502.

Signals CP 601 and 602 are resulted output signals of the second CMOS 162 while input signals 501, 502 are fed. Referring to the circuit shown in FIG. 3, that state of pMOS 201 is cut off and nMOS 202 is saturated while CP=1 and CK0=1. The charges of the capacitor 204 will conducted to ground through the nMOS 202. On the other hand, CP=0 and CK0=0 will turn off the nMOS 202 but turn on the pMOS 201. In the situation, the capacitor 204 is charged. In the other situation of CP=1 and CK0=0, both pMOS 201 and nMOS 202 will turned off. The charges in the capacitor are thus held. Thereafter, the terminal voltage PU0 of capacitor versus time varied 203 is shown in FIG. 4. The capacitor 204 will be discharged 701 during the pulse 601 until the ending of 601. Thereafter, the capacitor is charged again, as is indicated by numeral 702. The appearance of the short pulse 602 will make the capacitor 204 discharge again. Thus, if the time interval between the pulse 601 and 602 is small, the signal PU0 will not able to rise over the threshold voltage VTH of the fourth inverter 251, as a result, the output of the pulse detected of capacitor and signal output circuit 250 will be hold as it was.

When L1 followed with input signal H1 is not width enough, as is shown in FIG. 4, the signal X01 will generate the pulse 402 and the corresponding signal CP0 will generate pulse 502. Though the capacitor 204 is charged as is indicated by 703 in FIG. 4, the signal is still not over the $V_{TH}$.

When the input signal H2 followed with the signal L1 is wide enough, then the capacitor 204 is charged at the end of pulse 603 till the pulse 604 presents. During the charging time, the voltage of the signal PU0 will surpass the $V_{TH}$ and then makes the pulse detected of capacitor and signal output circuit 250 generate pulse 804. The pulse 804 is fed to the flip-flop 255 causes output terminal of the flip-flop outputs a signal that is the same as signal IN while the left edge of the pulse 804 raising.

it is worth noting that not only will the high-pulse such as H1 and H2 charge the capacitor 204, (please see the signals 702, and 704), the low-pulses such as L1 and L2 will also charge the capacitor 204 too (please see the signals 703, and 705). Hence, the circuit proposed by the present invention not only provides to filter those short high-pulses, but also those short low-pulses. For instance, if the width of the low-pulse L2 is not large enough, the charged signal 705 will be not able to generate a pulse at terminal PU. By contrast, the pulse 805 is generated when the width of the low-pulse L2 is enough, as is shown in FIG. 4.

The charge rate of the capacitor 204 is determined by a ratio of the channel/width channel length (W/L) of the pMOS 201. The larger ratio will provide a large current and thus results in larger charge speed. A ratio of the W/L of the nMOS 202 will determine the discharged speed. The size of capacitor 204 is also critical. It should make the voltage PU0 over $V_{TH}$ of the inverter 251. The W/L ratio of the pMOS

201 together with the size of the capacitor 204 will be designed to determine the size of the pulse to be filtered. Accordingly, for a capacitor 204 of 0.05 pF, with a filtered pulse, the W/L ratio of nMOS 202 at 4 μm/0.22 μm will cause the capacitor to be discharged completely at 0.5 ns. For most requirements the discharged time should be within 1 ns. As a result, this requirement is advantageously satisfied by the above.

While there have been described above the principles of the present invention in conjunction with specific devices, it is to be clearly understood that the foregoing description is made only by way of example and not as a limitation to the scope of the invention, Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicity or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A short pulse rejection circuit, comprising:
   a signal detected and converted circuit for receiving an input pulse signal and generating a detected pulse while said input pulse signal has a pulse edge raising or falling;
   a control signal generating circuit generating a first control signal and a second control signal while receiving said detected pulse, wherein said control signal generating circuit is composed of a first inverter, a second inverter, a third inverter, a first D flip-flop, and a second CMOS, and still said first inverter, second inverter, and third inverter are connected in series to a clock terminal of said first D flip-flop and said first D flip-flop is with a power source as an input signal and has an output terminal connecting to an input terminal of said second CMOS;
   a resetting and charging circuit including a pMOS and a nMOS and a capacitor, said nMOS and said capacitor in parallel connected and said pMOS cascode thereover, still said first control signal and said second control signal being connected, respectively, to input terminals of said pMOS and said nMOS to determine charging or discharging of said capacitor;
   a capacitor pulse detected and signal outputting circuit in series connected to said resetting and charging circuit to generate a desired output signal free from any short pulse while said capacitor is charged and with a terminal voltage of said capacitor over a predetermined voltage.

2. The short pulse rejection circuit according to claim 1, wherein said signal detected and converted circuit comprises a first CMOS, a first delayed circuit, an exclusion-or gate, and said first CMOS has an input terminal receiving said input pulse signal and then outputs an inverse signal to said first delay circuit, and still said exclusion-or gate operates said inverse signal and a delayed signal outputted from said first delayed circuit.

3. The short pulse rejection circuit according to claim 1, wherein said signal detected and converted circuit will output a pulse while an edge of said input pulse signal raises or falls.

4. The short pulse rejection circuit according to claim 1, further comprises a second delayer circuit connected in between said first inverter and said second inverter to prevent occurrence of said D flip-flop.

5. The short pulse rejection circuit according to claim 1, wherein said first control signal is an output signal of said second CMOS and said second control signal is generate from said second inverter.

6. The short pulse rejection circuit according to claim 1, wherein said capacitor pulse detected and signal outputting circuit comprises a fourth inverter, a fifth inverter and a second D flip-flop, and said fourth inventor and said fifth inverter are connected in series to a clock terminal of said second D flip-flop and said second D flip-flop has an input terminal receiving said input pulse signal and has an output terminal outputting said desired output signal.

7. The short pulse rejection circuit according to claim 1, wherein a width of said short pulse desired to be removed being determined by a W/L ratio of said pMOS, where W, L are, respectively, a channel width and length of said pMOS.

* * * * *